US010396159B2

(12) United States Patent
Liu et al.

(10) Patent No.: US 10,396,159 B2
(45) Date of Patent: Aug. 27, 2019

(54) FINFET CASCODE LATERALLY-DIFFUSED SEMICONDUCTOR DEVICE

(71) Applicant: Avago Technologies General IP (Singapore) Pte. Ltd., Singapore (SG)

(72) Inventors: Qing Liu, Irvine, CA (US); Akira Ito, Irvine, CA (US)

(73) Assignee: AVAGO TECHNOLOGIES INTERNATIONAL SALES PTE. LIMITED, Singapore (SG)

(*) Notice: Subject to any disclaimer, the term of this patent is extended or adjusted under 35 U.S.C. 154(b) by 0 days.

(21) Appl. No.: 15/798,310

(22) Filed: Oct. 30, 2017

(65) Prior Publication Data

US 2019/0131402 A1     May 2, 2019

(51) Int. Cl.
*H01L 29/78* (2006.01)
*H01L 29/10* (2006.01)
*H01L 27/088* (2006.01)
*H01L 29/423* (2006.01)

(52) U.S. Cl.
CPC ...... *H01L 29/1045* (2013.01); *H01L 27/0886* (2013.01); *H01L 29/1095* (2013.01); *H01L 29/42356* (2013.01); *H01L 29/7816* (2013.01)

(58) Field of Classification Search
CPC ............ H01L 29/1045; H01L 29/7816; H01L 29/42356; H01L 27/0886; H01L 29/1095; H01L 27/0924; H01L 21/31051; H01L 27/0207; H01L 29/0649; H01L 21/32115; H01L 21/823828; H01L 29/66681; H01L 21/823821; H01L 29/0657; H01L 29/4966; H01L 29/0882; H01L 29/66545; H01L 29/4983; H01L 29/785; H01L 29/1037; H01L 29/0653; H01L 29/66659; H01L 29/7835; H01L 29/66689; H01L 21/28088
See application file for complete search history.

(56) References Cited

U.S. PATENT DOCUMENTS

| 2006/0180861 | A1* | 8/2006 | Tsujiuchi | H01L 29/66772 257/347 |
| 2015/0357462 | A1* | 12/2015 | Ponoth | H01L 29/66681 257/329 |
| 2015/0380398 | A1* | 12/2015 | Mallikarjunaswamy | H01L 29/7823 257/272 |
| 2017/0194487 | A1* | 7/2017 | Chen | H01L 29/0649 |

* cited by examiner

*Primary Examiner* — Moin M Rahman
(74) *Attorney, Agent, or Firm* — Morgan, Lewis & Bockius LLP

(57) ABSTRACT

A semiconductor device includes a substrate having a first well region comprising a first dopant and a second well region comprising a second dopant. The semiconductor device includes semiconductor fin structures formed on the substrate, where at least one semiconductor fin structure has a channel region along a channel axis through the first well region. The semiconductor device includes a drain region and a source region formed on the semiconductor fin structures. The first well region and the drain region are formed to operate at a first operating voltage, and the second well region and the source region are formed to operate at a second operating voltage that is smaller than the first operating voltage. The semiconductor device includes a gate structure and a dummy gate disposed on respective portions of the semiconductor fin structures, where the dummy gate is disposed between the gate structure and the drain region.

16 Claims, 4 Drawing Sheets

FINFET CASCODE LATERALLY-DIFFUSED SEMICONDUCTOR DEVICE

TECHNICAL FIELD

The present application generally relates to semiconductor devices, and more particularly, but not exclusively, to FinFET cascade laterally-diffused semiconductor devices and fabrication process thereof.

BACKGROUND

As semiconductor devices are increasing in layout density, technology scaling has led to development of fin-based, also referred to as FinFET structures as an alternative to bulk metal-oxide-semiconductor FET structures for improved scalability. The FinFET utilizes a semiconductor fin to wrap the conducting channel, and the fin forms the body of the transistor. In effect, the gate electrode of the transistor straddles or surrounds the fin. During operation, current flows between the source and drain terminals along the gated sidewall surfaces of the fin.

It has been recognized that many integrated circuit designs require both low operating voltage FETs for their ability to operate at high frequencies, and high operating voltage FETs for their ability to interface with high voltage signals of auxiliary devices. As such, FET devices include a lateral disposition of a core well (e.g., for low operating voltages) and an input/output (I/O) well (e.g., for high operating voltages). As the technology in lateral disposition moves to 7 nm and beyond, the shallow trench isolation quality worsens due to lower temperature annealing, resulting in worse hot carrier injection that leads to larger drive current degradation stemming from the elevated density of interference states.

BRIEF DESCRIPTION OF THE DRAWINGS

Certain features of the subject disclosure are set forth in the appended claims. However, for purpose of explanation, several implementations of the subject disclosure are set forth in the following figures.

DETAILED DESCRIPTION

Figure 1A:
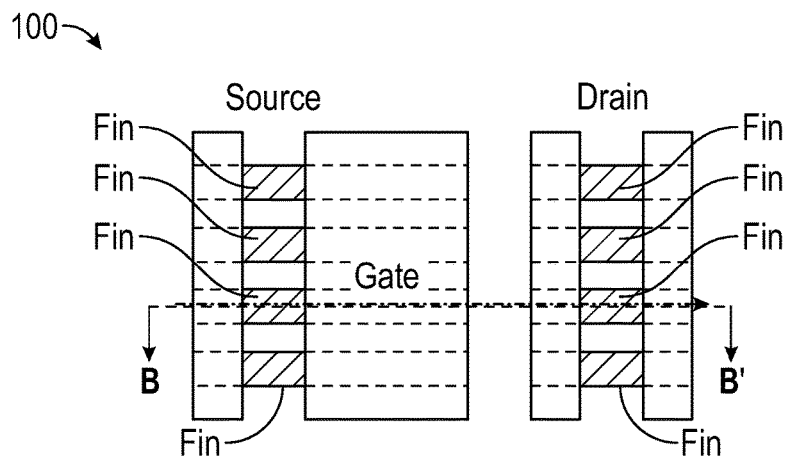
FIGS. 1A and 1B illustrate a planar view of a laterally-diffused semiconductor device and a cross-sectional view of the laterally-diffused semiconductor device along B-B' according to one or more implementations.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations.

As used herein, the term "substrate" refers to the physical object that is the basic workpiece transformed by various process operations into the desired microelectronic configuration. A typical substrate used for the manufacture of integrated circuits is a wafer. Wafers may be made of semiconducting (e.g., bulk silicon), non-semiconducting (e.g., glass), or combinations of semiconducting and non-semiconducting materials (e.g., silicon-on-insulator (SOI)). In the semiconductor industry, a bulk silicon wafer is commonly used for the manufacture of integrated circuits.

As used herein, the term "gate structure" refers to an insulated gate terminal of a FET device. The physical structure of the gate terminal is referred to as a gate electrode. "Source/drain (S/D) terminals" refer to the terminals of a FET device between which conduction occurs under the influence of an electric field subsequent to inversion of the semiconductor surface under the influence of an electric field resulting from a voltage applied to the gate terminal of the FET device. Generally, the source and drain terminals of a FET are fabricated such that the source and drain terminals are geometrically symmetrical. With geometrically symmetrical source and drain terminals, these terminals can be simply referred to as source/drain terminals. Chip designers often designate a particular source/drain terminal to be a "source" or a "drain" on the basis of the voltage to be applied to that terminal when the FET device is operated in a circuit.

The present disclosure provides for a semiconductor device that includes a substrate having a first well region comprising a first dopant and a second well region comprising a second dopant. The semiconductor device includes one or more semiconductor fin structures formed on the substrate. In some aspects, the at least one semiconductor fin structure has a channel region along a channel axis through the first well region. The semiconductor device includes a drain region formed on the one or more semiconductor fin structures. The semiconductor device includes a source region formed on the one or more semiconductor fin structures. In some aspects, the first well region and the drain region are formed to operate at a first operating voltage. In some aspects, the second well region and the source region are formed to operate at a second operating voltage that is smaller than the first operating voltage. The semiconductor device includes a gate structure disposed on at least a portion of the one or more semiconductor fin structures. The semiconductor device includes a dummy gate disposed on at least a portion of the one or more semiconductor fin structures. In some aspects, the dummy gate is disposed between the gate structure and the drain region.

Figure 1B:
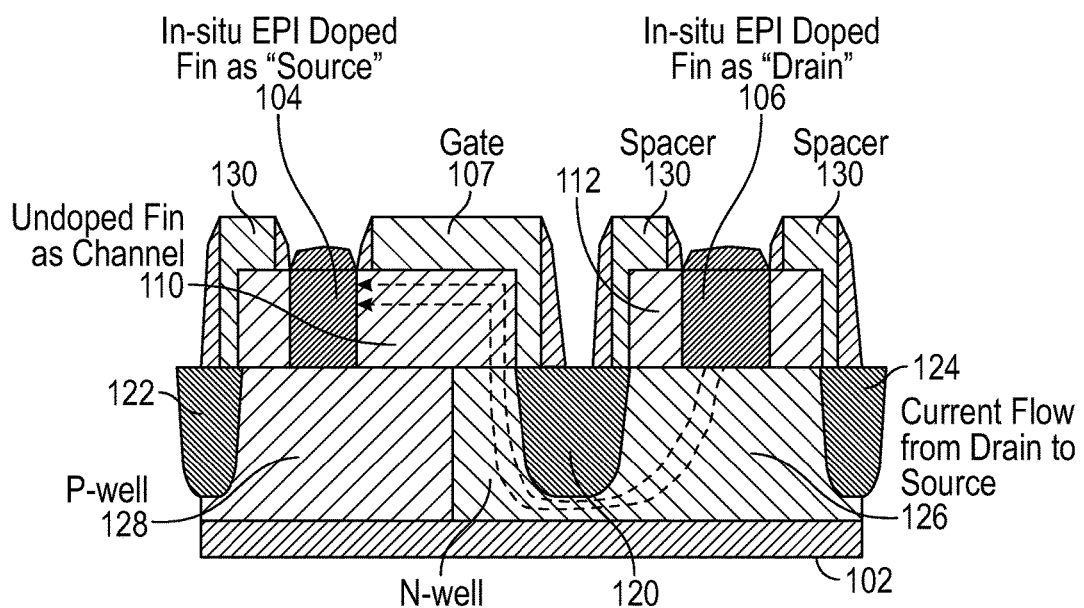

FIGS. 1A and 1B illustrate a planar view of a laterally-diffused semiconductor device 100 and a cross-sectional view of the laterally-diffused semiconductor device along B-B' according to one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided. In any implementation, what is shown as one layer of material (e.g., dielectric layer, metal layer, and so forth) may be realized with multiple layers of materials, where each layer may be of a thickness and/or material different from an adjacent layer.

The laterally-diffused semiconductor device 100 includes a substrate 102 (e.g., a P-type substrate (Psub)), in which a P-well region 128 and an N-well region 126 are created. The P-well region 128 forms the source region and the N-well region 126 forms the drain region of the laterally-diffused semiconductor device 100. A gate structure is formed on a semiconductor fin structure 110. The source and drain contacts (e.g., silicide) 104 and 106 are formed on a heavily doped n+ region of semiconductor fin structures 110 and 112, respectively. A shallow trench isolation (STI) region 120 enables creation of a longer length depletion region in the N-well 126, as the depletion region can form around the sides (e.g., walls and a bottom side) of the STI region 120. The STI regions 122, 124 are formed for isolation and protection for the laterally-diffused semiconductor device 100.

The laterally-diffused semiconductor device 100 is formed onto the substrate 102 of one conductivity type. For example, the laterally-diffused semiconductor device 100 may be formed in the substrate 102 having a p-type material. The substrate 102 represents a physical material on which the laterally-diffused semiconductor device 100 is formed. The p-type material includes impurity atoms of an acceptor type that are capable of accepting an electron, such as, but not limited to, boron or indium to provide some examples. Other materials such as gallium-arsenide, silicon-germanium, among other suitable substrate materials identifiable by a person skilled in the art may also be utilized in the process, in accordance with one or more implementations. Alternatively, the laterally-diffused semiconductor device 100 may be formed in the substrate 102 having an n-type material.

A first semiconductor fin structure is formed over a first well region (e.g., p-well). The semiconductor fin structure may be a heavily doped region of substantially opposite conductivity as the substrate 102 that represents a source region 104 of the laterally-diffused semiconductor device 100. In this embodiment, the source region 104 represents an n-type source terminal for the semiconductor device 100. In one or more implementations, the source region 104 contains a heavily doped region of substantially the same conductivity as the substrate 102, forming a p-type source terminal.

A first specially implanted p-type region is associated with low operating voltages; hence known as a core well region 128. The core well region 128 may be positioned below the source region 104 and the gate structure 107. As shown in FIG. 1A, the core well region 128 may include a first side being in contact with a first side of the I/O well region 126. The core well region 128 may extend from the first side of the core well region 128 positioned below at least a portion of the gate structure 107 to a second side of the core well region 128 positioned below at least a portion of the first semiconductor fin structure 110 such that the core well region 128 extends below substantially all of the source region 104. The substrate 102 may be implanted with the p-type material to form the core well region 128.

A second semiconductor fin structure 112 is formed over a second well region (e.g., n-well). The second semiconductor fin structure 112 may be a heavily doped region of substantially opposite conductivity as the substrate 102 represents a drain region 106 of the laterally-diffused semiconductor device 100. In this embodiment, the drain region 106 represents an n-type drain terminal for the semiconductor device 100. In one or more implementations, the drain region 106 contains a heavily doped region of substantially the same conductivity as the substrate 102, forming a p-type drain terminal.

A second specially implanted n-type region is associated with high operating voltages; hence known as an I/O well region 126. The I/O well region 126 may be positioned below the drain region 106 and (a portion of) the gate structure 107. The substrate 102 may be implanted with the n-type material to form the I/O well region 126. The I/O well region 126 may extend from a first side of the I/O well region 126 positioned below at least a portion of the gate structure 107 to a second side of the I/O well region 126 positioned below at least a portion of the second semiconductor fin structure 112 such that the I/O well region 126 extends below substantially all of the drain region 106.

The gate structure 107 is deposited over a portion of the substrate 102 and the semiconductor fin structure 104 to form a channel region between the source region 104 and the drain region 106. In effect, the gate structure 107 straddles or surrounds the semiconductor fin structure 110. The gate structure 107 is positioned between the source region 104 and the drain region 106. The gate structure 107 may be referred to as the "active" gate because during operation of a completed chip, the gate structure 107 receives a signal that controls electrical conduction between the source region 104 and the drain region 106. During operation, current flows from the drain region 106 to the source region 104 along the gated sidewall surfaces of the semiconductor fin structure 110. In one or more implementations, the laterally-diffused semiconductor device 100 includes epitaxially-grown structures formed outside of the gate structure 107, respectively referred to as the source region 104 and the drain region 106. The epitaxially-grown structures may be heavily doped compared to the channel region.

Spacers 130 are deposited over a portion of the semiconductor fin structures (e.g., 110, 112) and the substrate 102 where the STI 120, 122, 124 are located. Like the gate structure 107, the spacers 130 straddle or surround the semiconductor fin structures 110, 112. The spacers 130 are positioned such that the spacers 130 isolate the in-situ epitaxial growth from the remaining portions of the semiconductor fin structures 110, 112. The spacers 130 may include sidewall s.

Generally, implanting a comparatively small number of atoms, approximately in a range of about $5 \times 10^{18}$ atoms/cm$^3$ to about $1 \times 10^{19}$ atoms/cm$^3$, refers to an implanting that is low or light. Similarly, implanting a comparatively large number of atoms, in a range of about $1 \times 10^{19}$ atoms/cm$^3$ to about $5 \times 10^{20}$ atoms/cm$^3$, refers to an implanting that is high or heavy.

The source region 104 and the drain region 106 may have in-situ N+ doped epitaxy grown or be implanted with N+ material to form a first N+ region corresponding to the source region 104 and a second N+ region corresponding to the drain region 106, respectively. The "+" indicates that the region is implanted with a higher carrier concentration than a region not designated by a "+." For instance, an N+ region generally has a greater number of excess carrier electrons than an n-type region. A P+ region typically has a greater number of excess carrier holes than a p-type substrate. The n-type material includes impurity atoms of a donor type that are capable of donating an electron, such as, but not limited to, phosphorus, arsenic, or antimony to provide some examples.

A first shallow-trench isolation (STI) region 120, and second/third second STI regions 122, 124 provide isolation and/or protection for the laterally-diffused semiconductor device 100 from neighboring active and passive elements integrated with and/or formed on the substrate 102. The first STI may be positioned adjacent to and/or in contact with the core well region 128 (or n-well). Likewise, the third STI 124 may be positioned adjacent to and/or in contact with core well region 128. The second STI 122 may be positioned adjacent to and/or in contact with the I/O well region 126 (or p-well). The STI 120, 122 and 124 may be formed using a dielectric material such as $SiO_2$, though any suitable material may be used.

Core transistors (e.g., transistors operating in the core region) can switch at high speed (or high frequencies) but operate at low voltage, whereas I/O transistors (e.g., transistors operating in the I/O region) can operate at high voltage but switch at lower speeds. Disclosed herein are structures of FETs having a unique combination of properties, which are operable to interface with relatively high voltage signals and to simultaneously operate with relatively high cut-off frequency bands ($f_T$). It is noted that $f_T$ refers to the frequency at which the small signal gain of the transistor drops to unity.

A p-n junction is a potential barrier created by combining the n-type and the p-type material. A first interface between the substrate 102 and the source region 104 may represent a first p-n junction. Likewise, a second interface between the substrate 102 and the drain region 106 may represent a second p-n junction. The first p-n junction and/or the second p-n junction may prevent current conduction from the drain region 106 to the source region 104 upon the application of a voltage from the drain region 106 to the source region 104. On the other hand, applying a first potential, such as a positive direct current (DC) voltage to provide an example, to the gate structure 107 and a second potential, such as a ground potential to provide an example, to the source region 104 may cause a voltage to appear between the gate structure 107 and the source region 104. The first potential on the gate structure 107 repels the positively charged carrier holes below the gate structure 107 forming a channel region between the source region 104 and the drain region 106 in the laterally-diffused semiconductor device 100.

The channel region can be defined as a current path from the drain region 106, through the I/O well region 126, beneath the STI 120, along the sidewalls of the semiconductor fin structure 110, and to the source region 104. The current flow through the STI boundary creates a high density of interface states that lowers the drive current through the channel region. In this regard, defects form when injecting current beneath the STI 120. The present disclosure provides for the current bypassing the STI edge and avoids the creation of interface traps that hinder the drive current through the channel region of traditional laterally-diffused semiconductor devices.

Figure 2A:
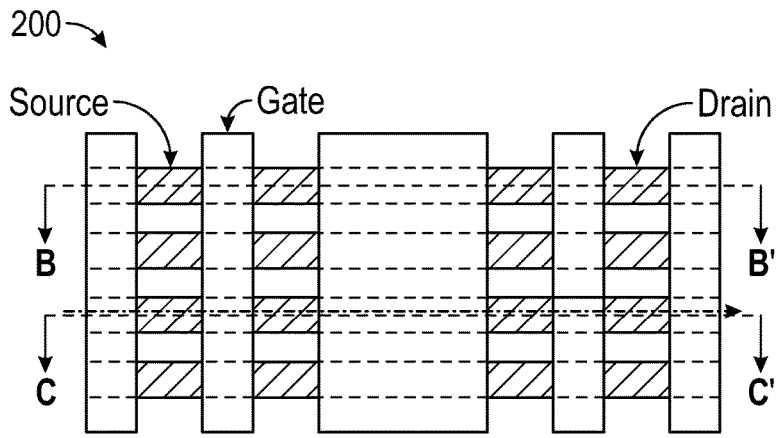
FIGS. 2A to 2C illustrate a planar view of a laterally-diffused semiconductor device and cross-sectional views of the laterally-diffused semiconductor device respectively along B-B' and C-C' according to one or more implementations.
Figure 2B:
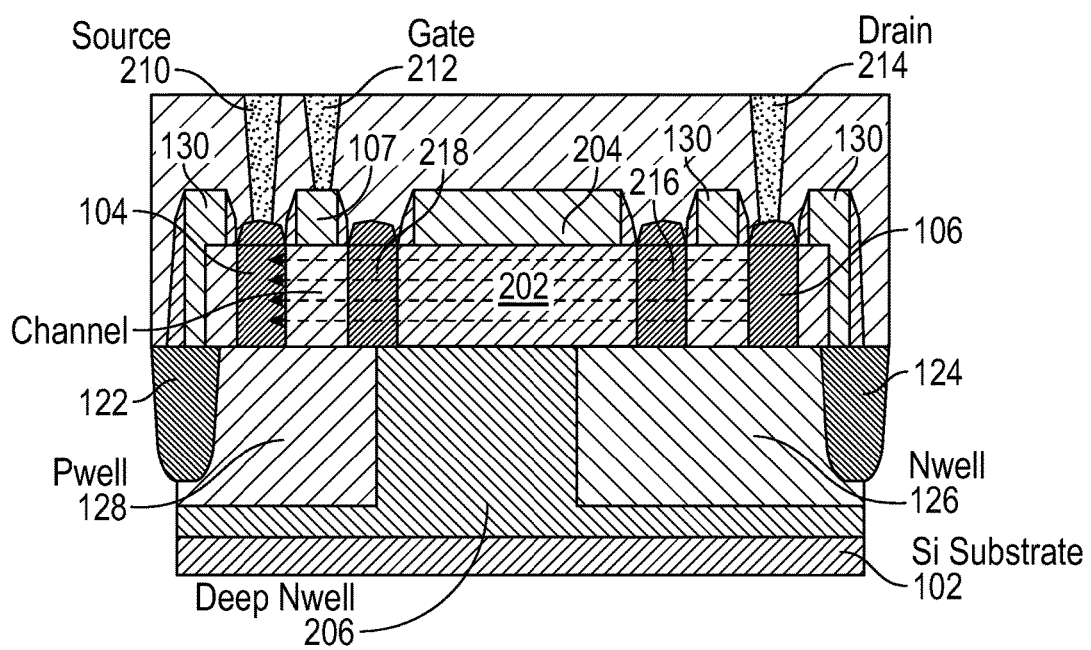
Figure 2C:
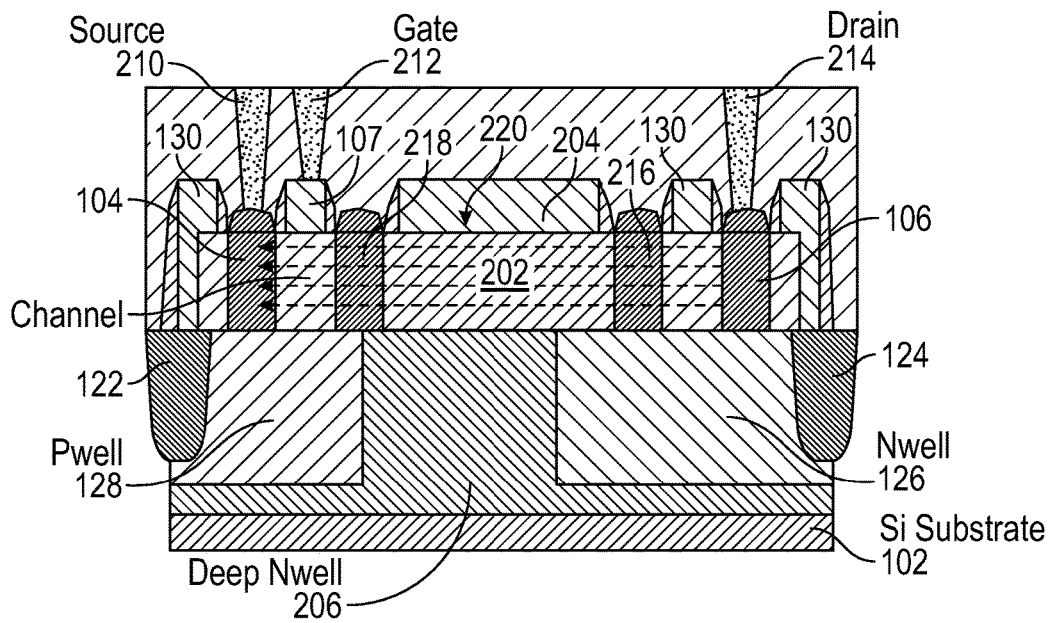

FIGS. 2A to 2C illustrate a planar view of a laterally-diffused semiconductor device 200, a cross-sectional view of the laterally-diffused semiconductor device along B-B', and a cross-sectional view of the laterally-diffused semiconductor device along C-C' according to one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

Because the features described in FIGS. 1A and 1B are similar to the features of FIGS. 2A and 2B, only differences between the figures will be described in reference to FIGS. 2A and 2B. For purposes of simplification, the implementations described in FIGS. 2A and 2B will be discussed primarily in reference to the gate structure 107, the source region 104 and the drain region 106.

The laterally-diffused semiconductor device 200 includes a substrate 102, such as a silicon (Si) substrate. The laterally-diffused semiconductor device 200 also includes the source region 104, the drain region 106, the gate structure 107, the STIs 122 and 124, the I/O well region (n-well) 126, the core well region (p-well) 128, and the spacers 130. The spacers 130 may have a spacer height approximately in a range of about 50 nm to 80 nm, and a spacer width approximately in a range of about 5 nm to 20 nm.

In this embodiment, the laterally-diffused semiconductor device 200 includes a semiconductor fin structure 202 in lieu of the semiconductor fin structures 110 and 112 of FIG. 1B. Additionally, the laterally-diffused semiconductor device 200 includes a dummy gate 204 disposed on the semiconductor fin structure 202. In one or more implementations, the dummy gate 204 is disposed over an array of semiconductor fins (see FIG. 2A). The laterally-diffused semiconductor device 200 includes conductive contacts 210, 212 and 214. The conductive contact 210 serves as a source contact for the source region 104, the conductive contact 212 serves as a gate contact for the gate structure 107, and the conductive contact 214 serves as a drain contact for the drain region 106.

In FIG. 2B, the laterally-diffused semiconductor device 200 includes a deep n-well layer 206 disposed on the substrate 102 and positioned laterally to and in direct contact with the core well region 128 and the I/O well region 126. In some aspects, the deep n-well layer 206 is disposed directly beneath the core well region 128 and the I/O well region 126 such that the core well region 128 is positioned laterally to and in direct contact with the I/O well region 126. In some implementations, the deep n-well layer 206 is formed within the substrate 102 as part of an ion implantation operation. For example, the deep n-well layer 206 may be implanted after the doping of the substrate 102. In other implementations, the deep n-well 206 may be omitted from the laterally-diffused semiconductor device 200 without departing from the scope of the disclosure. In one or more implementations, the laterally-diffused semiconductor device 200 includes the p-well (e.g., the I/O well region 126) and the deep n-well 206 while omitting the core well region 128 without departing from the scope of the disclosure.

In other implementations, the laterally-diffused semiconductor device 200 includes I/O well region 126 positioned laterally to and in direct contact with the core well region 128 without departing from the scope of the disclosure. In still other implementations, the laterally-diffused semiconductor device 200 includes the I/O well region 126 disposed over the substrate 102 while omitting the core well region 128 and the deep n-well 206 without departing from the scope of the disclosure. The implementations with respect to FIGS. 2A and 2B may be implemented in n-type FET devices and p-type FET devices. For example, the substrate and the wells (e.g., core and I/O) may be p-type with n-type transistors (e.g., source and drain) for n-type FET devices. Alternatively, the substrate may be p-type and the wells may be n-type with p-type well transistors for p-type FET devices.

In one or more implementations, the source region 104 is formed to operate at a smaller operating voltage than that of the drain region 106. For example, the source region 104 is formed to operate at an operative voltage of about 1.8 V, but other suitable operating voltages may be applied to the source region 104 depending on implementation. In another example, the drain region 106 is formed to operate at an operative voltage of about 5.0 V, but other suitable operating voltages may be applied to the drain region 106 depending on implementation.

In one or more implementations, the semiconductor fin structure 202 is undoped, also referred to as intrinsic doping. In one or more implementations, the semiconductor fin structure 202 is a lightly doped region, also referred to as an LDD region. Generally, the light doping concentration is approximately in a range of about $1 \times 10^{16}$ atoms/cm$^3$ to about $1 \times 10^{18}$ atoms/cm$^3$. The semiconductor fin structure 202 may have a fin height approximately in a range of about 30 nm to 70 nm, and a fin width approximately in a range of about 5 nm to 20 nm.

The dummy gate 204 serves as a floating gate to block the semiconductor fins 202 positioned underneath the dummy gate 204 from the highly doped epitaxial growth. In foundry processes, all of the exposed semiconductor fin structures without gate covering, will have either n-type or p-type highly doped epitaxial growth (e.g., 216, 218). Therefore, the floating gate acts as an epitaxial blocking layer. The epitaxial growth structures 216, 218 may have widths approximately in a range of about 80 nm to 120 nm. Generally, the high doping concentration is approximately in a range of about $5 \times 10^{19}$ atoms/cm$^3$ to about $1 \times 10^{21}$ atoms/cm$^3$. As shown in FIGS. 2A and 2B, the gate structure 107 is smaller than the dummy gate 204 because the dummy gate 204 is being relied upon to adapt the voltage drop between the drain region 106 and the source region 104. In one or more implementations, the size of the dummy gate 204 depends on the amount of voltage drop required between the drain region 106 and the source region 104. In this respect, the amount of resistance formed in the semiconductor fin structure 202 may be a function of its length, its width, or a combination thereof.

In order to increase the drive current from drain (e.g., 106) to source (e.g., 104) through the semiconductor fins (e.g., 202) of the laterally formed semiconductor device and thereby facilitate a voltage drop large enough across the channel region, a dummy gate is formed between the source and drain in lieu of forming the STI. In this regard, the drive current flows directly across the axial length of the semiconductor fin 202 between the drain and source, thereby avoiding formation of any interface traps that hinders the drive current. In contrast, defects are formed in the laterally-diffused semiconductor device 100 when drive current is injected beneath the STI (e.g., 120) and, thus, adversely impacting the drive current between the drain and source. In FIG. 2B, the voltage drop occurs in the channel region through the core well region 128 (or n-well) and the deep n-well 206.

Because the features described in FIG. 2B are similar to the features of FIG. 2C, only differences between the figures will be described in reference to FIG. 2C. To reduce the "ON" state resistance formed in the semiconductor fin structure 202, the semiconductor fin structure 202 can be doped with a greater doping concentration (e.g., closer to the heavy doping concentrations). In this regard, the same mask for the threshold voltage (Vt) shift can be reused without the need of an additional mask layer.

Figure 3:
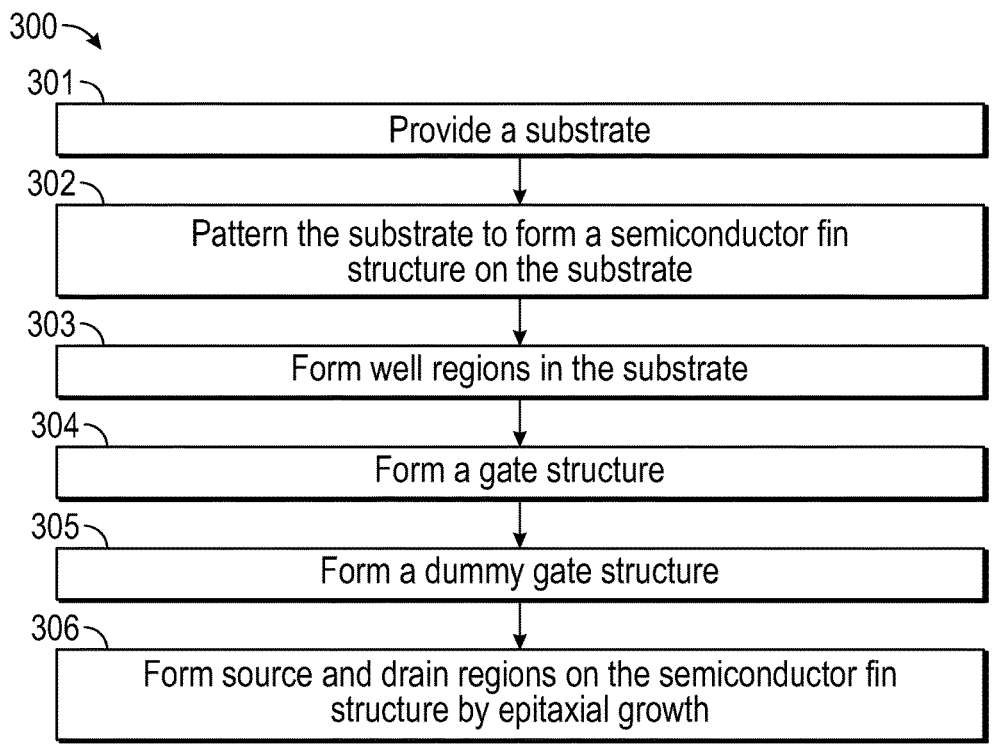
FIG. 3 illustrates a sequential fabrication process for forming a FinFET laterally-diffused semiconductor device according to one or more implementations.

FIG. 3 illustrates a sequential fabrication process 300 for forming the laterally-diffused semiconductor device 200 of FIGS. 2A to 2C in accordance with one or more implementations. Further for explanatory purposes, the blocks of the sequential fabrication process 300 are described herein as occurring in serial, or linearly. However, multiple blocks of the sequential fabrication process 300 may occur in parallel. In addition, the blocks of the sequential fabrication process 300 need not be performed in the order shown and/or one or more of the blocks of the sequential fabrication process 300 need not be performed. Also, other fabrication operations may be introduced.

In this embodiment, the sequential fabrication process 300 relates to fabricating a laterally-diffused semiconductor device including a FinFET device. The sequential fabrication process 300 includes providing a substrate (301).

The sequential fabrication process 300 includes patterning the substrate to form one or more semiconductor fin structures on the substrate (302). In one or more implementations, a hardmask material is deposited and patterned using semiconductor fabrication techniques to form hardmask mandrels (not shown) on the top surface of the substrate 102. In one or more implementations, the patterning is performed using sidewall image transfer (SIT). The hardmask material can be, by way of example and not of limitation, oxide (e.g., silicon oxide) or nitride (e.g., silicon nitride).

In one or more implementations, etching is performed on the substrate 102 to remove one or more portions of the substrate 102 based on locations of the hardmask mandrels. In this regard, the substrate 102 is patterned by an etch operation to form one or more rows of recessed regions in the substrate 102, after which the hardmask mandrels are removed.

A semiconductor material may then be disposed into the respective recessed regions to form the one or more semiconductor fin structures. Thereafter, the dielectric material may be recessed to expose a portion of each of the semiconductor fin structures. The patterning may include implanting a dopant on the exposed semiconductor material to form the channel region by channel implantation.

The sequential fabrication process 300 includes forming well regions in the substrate (303). In one or more implementations, doping can be performed to dispose dopants onto the substrate 102 in regions not covered by a mask layer and thereby form the well regions. Specifically, portions of the substrate 102 beneath the top surface are doped to form respective doped portions of the substrate 102. The doping may be performed using one or more doping operations such as diffusion or an ion implantation with a defined ion dosage to yield a certain doping concentration in the implanted region of the substrate 102. If ion implantation is used, the ion implantation may be applied with a certain tilt angle and adjustable over a certain range of rotation. The doping can be n-type doping or p-type doping depending on implementation. In fabricating the laterally-diffused semiconductor device 200, the substrate 102 receives n-type dopants or p-type dopants by an ion implantation depending on the type of semiconductor device targeted.

Prior to the ion implantation, one or more mask layers are formed on the substrate 102. A layer of masking material such as photoresist may be deposited and patterned using semiconductor fabrication techniques to define regions protected by the masking material and regions not protected by the masking material. The mask layer may be patterned such that a section of the substrate 102 is blocked from a first ion implantation that is intended to apply a first type of dopant (or a dopant with a first doping concentration). In this regard, the blocked section during the first ion implantation would not receive any well implant dopants. Conversely, a second mask layer may be patterned such that the previously-unblocked section of the substrate 102 is now blocked from a second ion implantation that is intended to apply a second type of dopant (or a dopant with a second doping concentration).

As shown in FIG. 2B, the substrate 102 has a first well region implanted with a first dopant by the first ion implantation and a second well region implanted with a second dopant by the second ion implantation. In this embodiment, the first well region is implanted with a p-type material and the second well region is implanted with an n-type material. In one or more implementations, etching is performed to remove the mask layers used to block the different portions of the substrate 102 during the first and second ion implantations. It is noted that, although not shown in FIGS. 2A and 2B, doping can also be performed in regions outside of the well regions (e.g., 126, 128), where the doping can be, but need not be, different from the doping performed in the well regions (e.g., 126, 128). In one or more implementations, the doping may utilize an in-situ conformal doping source (e.g., material is doped when grown) such as a doped oxide.

The sequential fabrication process 300 also includes forming a gate structure on the substrate (304). The gate structure 107 may be disposed on at least a portion of the semiconductor fin structure 202 and directly above the core well region 128. The gate structure 107 may remain in place as the final gate structure of the split-gate semiconductor device 200, or the gate structure 107 may be removed and replaced with alternative gate dielectric and/or gate electrode materials. Gate replacement processes, for example high-k metal gate (HKMG), are well-known in the semiconductor manufacturing field and are not further described herein.

The sequential fabrication process 300 also includes forming a dummy gate on the substrate (305). The laterally-diffused semiconductor device 200 may include a dummy gate on the semiconductor fin structure 202 to isolate and/or restrict the epitaxy growth of the epitaxial growth structures 216, 218 between the drain region 106 and the source region 104. The dummy gate may be formed using a dielectric material, such as $SiO_2$, though any suitable material may be used.

The sequential fabrication process 300 includes forming source and drain regions on the semiconductor fin structure by epitaxial growth (306). In one or more implementations, the semiconductor fin structure 202 receives a mask layering such that the source/drain regions are exposed to receive a doping material different from that of the first and second ion implantations, hence forming the source region 104 and the drain region 106, for example. The doping material may be received by a deposition of a crystalline over-layer for a controlled growth of a crystalline doped layer of semiconductor material (e.g., Si).

The laterally-diffused semiconductor device may include spacers (e.g., 130) on the semiconductor fin structure 202 and adjacent to the source region 104 the drain region 106. The spacers 130 may be formed using a dielectric material, such as $SiO_2$, though any suitable material may be used. Additionally, the sidewalls and the body of the spacers (e.g., interposed between the sidewalls) may be formed using different dielectric material.

The sequential fabrication process 300 may include forming the deep n-well layer 206 on the substrate 102. In this embodiment, the deep n-well layer 206 may be disposed on the substrate and thereafter etched to form the well regions (e.g., 126, 128) over and around the deep n-well layer 206. The deep n-well may be by an ion implantation that is separate from the ion implantations performed to form the well regions (e.g., 126, 128).

The sequential fabrication process 300 may include forming shallow-trench isolation regions around the p-well (e.g., 128) and n-well (e.g., 126). In some aspects, the shallow-trench isolation regions may be disposed into recessed regions formed in the substrate 102. For example, a first shallow-trench isolation region may be disposed adjacent to and in contact with at least the core well region 128 and a second shallow-trench isolation region may be disposed adjacent to and in contact with the I/O well region 126. The first and second shallow-trench isolation regions are thereafter recessed using an etch operation (e.g., wet etch or dry etch) to form a conformal surface with the core well region 128 and the I/O well region 126.

In one or more implementations, the shallow-trench isolation regions include one or more layers of a high-k dielectric material and/or an oxide insulator material. For example, one or more layers of oxide material are deposited into the recessed region. The one or more layers of oxide material may be recessed as part of a STI process. The thickness of the recessed oxide material can be between 30 nm and 300 nm depending on implementation. The high-k dielectric material can include, but is not limited to, hafnium oxide, hafnium silicon oxide, lanthanum oxide, lanthanum aluminum oxide, yttrium oxide, lead zinc niobate, among other high-k dielectric materials identifiable by a person skilled in the art.

In one or more implementations, the oxide material can be deposited utilizing a molecular vapor deposition (MVD) process, although other suitable deposition processes may be utilized. The oxide material may be an oxide suitable for filling the trenches between formed (or patterned) semiconductor fin structures. The oxide material may have a low etch rate (such as a low hydrofluoric acid etch rate). Silicon dioxide ($SiO_2$) is generally used as the oxide material, although other suitable oxides can be used. The oxide material can be deposited utilizing a process such as a chemical vapor deposition (CVD), low pressure chemical vapor deposition (LPCVD), molecular layer deposition (MLD), among others.

Figure 4:
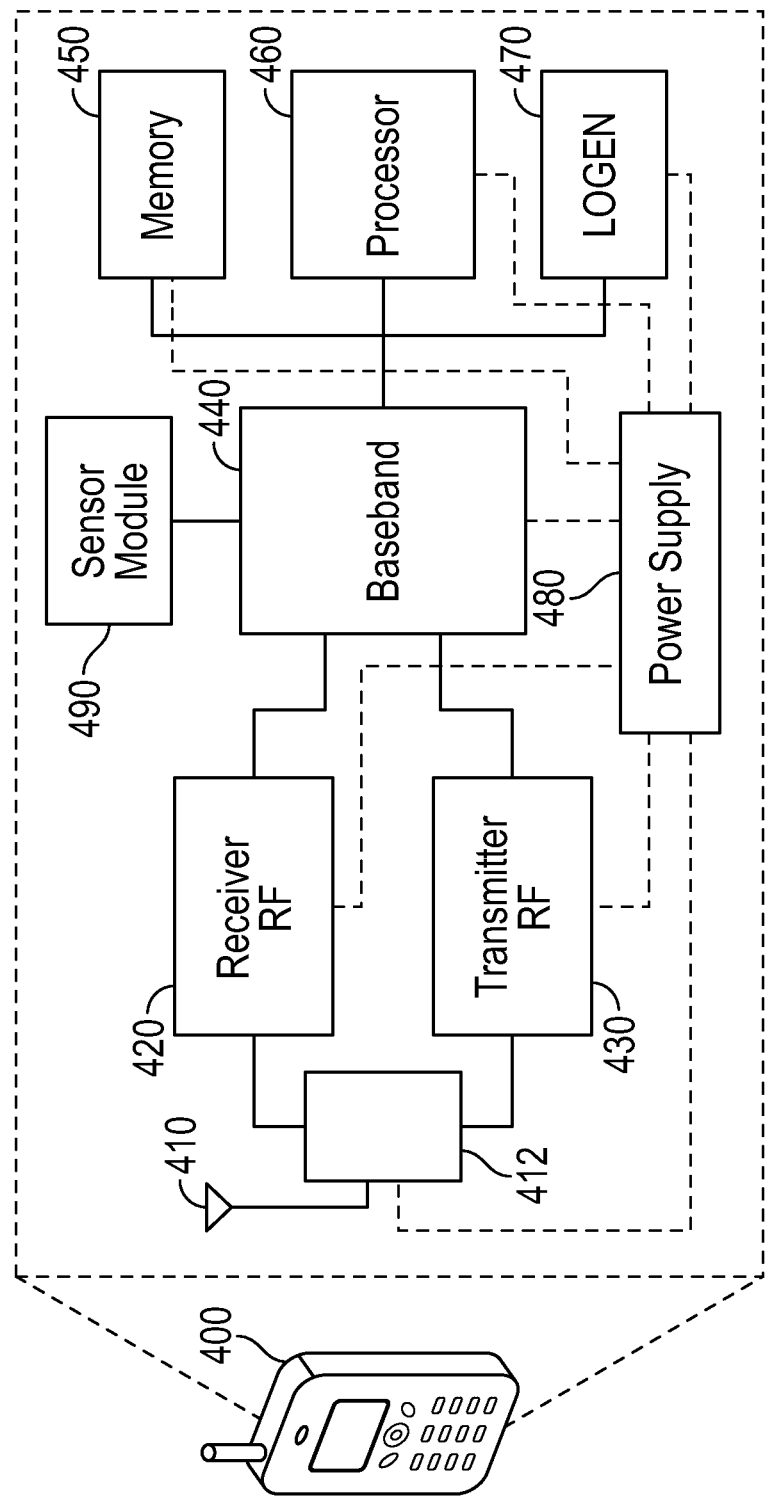
FIG. 4 illustrates an example of a wireless communication device employing features of the subject technology in accordance with one or more implementations of the subject technology.

FIG. 4 illustrates an example of a wireless communication device 400 employing features of the subject technology in accordance with one or more implementations of the subject technology. The wireless communication device 400 includes a radio-frequency (RF) antenna 410, a receiver 420, a transmitter 430, a baseband processing module 440, a memory 450, a processor 460, a local oscillator generator (LOGEN) 470, a power supply 480 and a sensor module 490. In various embodiments of the subject technology, one or more of the blocks represented in FIG. 4 can be integrated on one or more semiconductor substrates. For example, the blocks 420-470 can be realized in a single chip or a single system on chip, or can be realized in a multi-chip chipset.

The RF antenna 410 can be suitable for transmitting and/or receiving RF signals (e.g., wireless signals) over a wide range of frequencies. Although a single RF antenna 410 is illustrated, the subject technology is not so limited.

The receiver 420 comprises suitable logic circuitry and/or code that can be operable to receive and process signals from the RF antenna 410. The receiver 420 may, for example, be operable to amplify and/or down-convert received wireless signals. In various embodiments of the subject technology, the receiver 420 is operable to cancel noise in received signals and can be linear over a wide range of frequencies. In this manner, the receiver 420 is suitable for receiving signals in accordance with a variety of wireless standards such as Wi-Fi, WiMAX, Bluetooth, and various cellular standards.

The transmitter 430 comprises suitable logic circuitry and/or code that can be operable to process and transmit signals from the RF antenna 410. The transmitter 430 may, for example, be operable to up-convert baseband signals to RF signals and amplify RF signals. In various embodiments of the subject technology, the transmitter 430 is operable to up-convert and to amplify baseband signals processed in accordance with a variety of wireless standards. Examples of such standards include Wi-Fi, WiMAX, Bluetooth, and various cellular standards. In various embodiments of the subject technology, the transmitter 430 is operable to provide signals for further amplification by one or more power amplifiers.

In some implementations, the transmitter 430 includes an RF power amplifier that can be a high-voltage power amplifier fabricated using the LDMOS device (e.g. as shown in FIGS. 2A to 2C) of the subject technology.

The duplexer 412 provides isolation in the transmit band to avoid saturation of the receiver 420 or damaging parts of the receiver 420, and to relax one or more design requirements of the receiver 420. Furthermore, the duplexer 412 can attenuate the noise in the receive band. The duplexer is operable in multiple frequency bands of various wireless standards.

The baseband processing module 440 comprises suitable logic, circuitry, interfaces, and/or code that can be operable to perform processing of baseband signals. The baseband processing module 440 may, for example, analyze received signals and generate control and/or feedback signals for configuring various components of the wireless communication device 400 such as the receiver 420. The baseband processing module 440 is operable to encode, decode, transcode, modulate, demodulate, encrypt, decrypt, scramble, descramble, and/or otherwise process data in accordance with one or more wireless standards.

The processor 460 comprises suitable logic, circuitry, and/or code that can enable processing data and/or controlling operations of the wireless communication device 400. In this regard, the processor 460 is enabled to provide control signals to various other portions of the wireless communication device 400. The processor 460 can also control transfers of data between various portions of the wireless communication device 400. Additionally, the processor 460 can enable implementation of an operating system or otherwise execute code to manage operations of the wireless communication device 400.

The memory 450 comprises suitable logic, circuitry, and/or code that can enable storage of various types of information such as received data, generated data, code, and/or configuration information. The memory 450 includes, for example, RAM, ROM, flash, and/or magnetic storage. In various embodiment of the subject technology, the memory 450 may include a RAM, DRAM, SRAM, T-RAM, Z-RAM, TTRAM, or any other storage media.

In some implementations, the memory 450 includes a memory chip (e.g., 400 of FIG. 4) including a bitcell process monitor (e.g., 420 of FIG. 4) that provides process variation information including process corners to an assist circuitry (e.g., 414 of FIG. 4) of the memory chip. The assist circuitry can use the process corners as well as temperature corners provided by a temperature monitor to improve performance of the memory 450, for example, by enabling low-voltage mode of operation of the memory 450, which results in lower power consumption and longer lifetime of the memory 450.

The local oscillator generator (LOGEN) 470 comprises suitable logic, circuitry, interfaces, and/or code that can be operable to generate one or more oscillating signals of one or more frequencies. The LOGEN 470 can be operable to generate digital and/or analog signals. In this manner, the LOGEN 470 can be operable to generate one or more clock signals and/or sinusoidal signals. Characteristics of the oscillating signals such as the frequency and duty cycle can be determined based on one or more control signals from, for example, the processor 460 and/or the baseband processing module 440.

In operation, the processor 460 can configure the various components of the wireless communication device 400 based on a wireless standard according to which it is desired to receive signals. Wireless signals can be received via the RF antenna 410 and amplified and down-converted by the receiver 420. The baseband processing module 440 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 450, and/or information affecting and/or enabling operation of the wireless communication device 400. The baseband processing module 440 can modulate, encode and perform other processing on audio, video, and/or control signals to be transmitted by the transmitter 430 in accordance to various wireless standards.

In some implementations, the sensor module 490 includes one or more sensors, such as touch sensors that receive touch signals from a touch screen of the wireless communication device 400. In some aspects, the touch sensor module 490 includes sensor circuits including, for example, sensor drivers and other circuitry that use high breakdown voltage LDMOS of the subject technology.

As used herein, the terms "chip," "die," "integrated circuit," "semiconductor device," are applicable to the subject technology as these terms can be used interchangeably in the field of electronics. With respect to a chip, power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips can be made by way of electrical conductors, chips and other circuit elements may alternatively be coupled by way of, but not limited to, optical, mechanical, magnetic, electrostatic, and electromagnetic interfaces.

In the semiconductor industry environment of foundries and fabless companies, it is the foundries that develop, specify and provide the physical structures that designers use to implement their designs. Foundries provide manufacturing services to many fabless semiconductor companies, but to operate profitably, they must optimize their manufacturing processes to achieve high yields. Such optimizations typically require that limitations be placed on the variety of structures that can be produced by a particular manufacturing process. Foundries typically provide a limited set of transistor structures that are intended to cover a broad range of circuit applications.

One or more implementations are performed by one or more integrated circuits, such as application specific integrated circuits (ASICs) or field programmable gate arrays (FPGAs). In one or more implementations, such integrated circuits execute instructions that are stored on the circuit itself. The term "integrated circuit" or "semiconductor device" may include, but is not limited to, a design tool output file as binary code encompassing the overall physical design of the integrated circuit or semiconductor device, a data file encoded with code representing the overall physical design of the integrated circuit or semiconductor device, a packaged integrated circuit or semiconductor device, or an unpackaged die. The data file can include elements of the integrated circuit or semiconductor device, interconnections of those elements, and timing characteristics of those elements (including parasitics of the elements).

The various illustrative blocks, elements, components, and methods described herein may be implemented as electronic hardware. Various illustrative blocks, elements, components, and methods have been described above generally in terms of their functionality. Whether such functionality is implemented as hardware depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

Terms such as "top," "bottom," "above," "below," "beneath," "side," "horizontal," "vertical," and the like refer to an arbitrary frame of reference, rather than to the ordinary gravitational frame of reference. Thus, such a term may extend upwardly, downwardly, diagonally, or horizontally in a gravitational frame of reference.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. Such disclosure may provide one or more examples. A phrase such as an aspect may refer to one or more aspects and vice versa, and this applies similarly to other phrases.

Any implementation described herein as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A semiconductor device, comprising:
   a substrate having a first well region comprising a first dopant and a second well region comprising a second dopant;
   one or more semiconductor fin structures formed on the substrate, the one or more semiconductor fin structures having a channel region along a channel axis through the first well region;
   a drain region formed on the one or more semiconductor fin structures;
   a source region formed on the one or more semiconductor fin structures, the first well region and the drain region being formed to operate at a first operating voltage, the second well region and the source region being formed to operate at a second operating voltage that is smaller than the first operating voltage;
   a gate structure disposed on at least a portion of the one or more semiconductor fin structures;
   a dummy gate disposed on at least a portion of the one or more semiconductor fin structures, the dummy gate being disposed between the gate structure and the drain region; and
   a plurality of epitaxial growth structures formed on the one or more semiconductor fin structures, wherein the dummy gate is disposed between and adjacent to two epitaxial growth structures of the plurality of epitaxial growth structures, and wherein the plurality of epitaxial growth structures comprises a doping material having a doping concentration that is greater than that of at least one of the first dopant or the second dopant.

2. The semiconductor device of claim 1, wherein the dummy gate has a resistance that is directly proportional to a length of the dummy gate along the channel axis.

3. The semiconductor device of claim 1, wherein a first epitaxial growth structure of the plurality of epitaxial growth structures is formed in between and adjacent to the gate structure and the dummy gate, and wherein a second epitaxial growth structure of the plurality of epitaxial growth structures is formed in between and adjacent to the dummy gate and the drain region.

4. The semiconductor device of claim 3, further comprising a spacer disposed on the one or more semiconductor fin structures, wherein the spacer is disposed in between and adjacent to the second epitaxial growth structure and the drain region.

5. The semiconductor device of claim 1, wherein the dummy gate has a length that is greater than that of the gate structure along the channel axis.

6. The semiconductor device of claim 1, wherein at least a portion of the one or more semiconductor fin structures located directly beneath the dummy gate comprises a doping material having a doping concentration that is smaller than that of at least, one of the first dopant or the second dopant.

7. The semiconductor device of claim 6, wherein at least a portion of the one or more semiconductor fin structures located directly beneath the gate structure or the drain region has a doping concentration that is smaller than that of the at least a portion of the one or more semiconductor fin structures located directly beneath the dummy gate with the doping material.

8. The semiconductor device of claim 1, further comprising a deep n-well layer in contact with the substrate, wherein the deep n-well layer is disposed laterally adjacent to the first well region and the second well region.

9. A semiconductor device, comprising:
a substrate;
a first well region in the substrate, the first well region comprising a first dopant;
a second well region in the substrate, the second well region comprising a second dopant, the second well region located laterally from the first well region along a channel axis;
one or more semiconductor fin structures formed on the substrate, the one or more semiconductor fin structures having a channel region through the first well region;
a drain region formed on the one or more semiconductor fin structures;
a source region formed on the one or more semiconductor fin structures, the first well region and the drain region being formed to operate at a first operating voltage, the second well region and the source region being formed to operate at a second operating voltage that is smaller than the first operating voltage;
a gate structure disposed on at least a portion of the one or more semiconductor fin structures;
a dummy gate disposed on at least a portion of the one or more semiconductor fin structures, the dummy gate being disposed between the gate structure and the drain region; and
a plurality of epitaxial growth structures formed on the one or more semiconductor fin structures, wherein the dummy gate is disposed between and adjacent to two epitaxial growth structures of the plurality of epitaxial growth structures, and wherein the plurality of epitaxial growth structures comprises a doping material having a doping concentration that is greater than that of at least one of the first dopant or the second dopant.

10. The semiconductor device of claim 9, wherein the dummy gate has a resistance that is directly proportional to a length of the dummy gate along the channel axis.

11. The semiconductor device of claim 9, wherein a first epitaxial growth structure of the plurality of epitaxial growth structures is formed in between and adjacent to the gate structure and the dummy gate, and wherein a second epitaxial growth structure of the plurality of epitaxial growth structures is formed in between and adjacent to the dummy gate and the drain region.

12. The semiconductor device of claim 11, further comprising a spacer disposed on the one or more semiconductor fin structures, wherein the spacer is disposed in between and adjacent to the second epitaxial growth structure and the drain region.

13. The semiconductor device of claim 9, wherein the dummy gate has a length that is greater than that of the gate structure along the channel axis.

14. The semiconductor device of claim 9, wherein at least a portion of the one or more semiconductor fin structures located directly beneath the dummy gate comprises a doping material having a doping concentration that is smaller than that of at least one of the first dopant or the second dopant.

15. The semiconductor device of claim 14, wherein at least a portion of the one or more semiconductor fin structures located directly beneath the gate structure or the drain region has a doping concentration that is smaller than that of the at least a portion of the one or more semiconductor fin structures located directly beneath the dummy gate with the doping material.

16. The semiconductor device of claim 9, further comprising a deep n-well layer in contact with the substrate, wherein the deep n-well layer is disposed laterally adjacent to the first well region and the second well region.

* * * * *